(12) United States Patent
Kikuchi et al.

(10) Patent No.: US 7,457,994 B2
(45) Date of Patent: Nov. 25, 2008

(54) CODING APPARATUS AND DECODING APPARATUS FOR TRANSMISSION/STORAGE OF INFORMATION USING SYNCHRONIZATION CODE

(75) Inventors: Yoshihiro Kikuchi, Yokohama (JP);
Toshiaki Watanabe, Yokohama (JP);
Kenshi Dachiku, Kawasaki (JP);
Takeshi Chujoh, Shibuya-Ku (JP);
Takeshi Nagai, Higashi-Murayama (JP)

(73) Assignee: Kabushiki Kaisha Toshiba, Kawasaki-shi (JP)

( * ) Notice: Subject to any disclaimer, the term of this patent is extended or adjusted under 35 U.S.C. 154(b) by 100 days.

(21) Appl. No.: 11/418,105

(22) Filed: May 5, 2006

(65) Prior Publication Data

US 2006/0206787 A1 Sep. 14, 2006

Related U.S. Application Data

(60) Continuation of application No. 10/279,109, filed on Oct. 24, 2002, now Pat. No. 7,093,170, which is a division of application No. 09/580,430, filed on May 30, 2000, now Pat. No. 6,493,838, which is a division of application No. 09/148,164, filed on Sep. 4, 1998, now Pat. No. 6,249,895, which is a division of application No. 08/720,067, filed on Sep. 27, 1996, now Pat. No. 5,862,153.

(30) Foreign Application Priority Data

Sep. 29, 1995 (JP) .............................. 1995-276993

(51) Int. Cl.
*H03M 13/05* (2006.01)
(52) U.S. Cl. ..................................... 714/701
(58) Field of Classification Search .................. 714/701
See application file for complete search history.

(56) References Cited

U.S. PATENT DOCUMENTS 4,276,544 A 6/1981 Iinuma (Continued)

FOREIGN PATENT DOCUMENTS

EP 0 602 621 A2 6/1994

(Continued)

OTHER PUBLICATIONS

Notification of Reason for Rejection issued by the Japanese Patent Office dated Apr. 27, 2004, for Japanese Patent Application No. 8-243883, and English-language translation thereof.

(Continued)

*Primary Examiner*—Stephen M Baker
(74) *Attorney, Agent, or Firm*—Finnegan, Henderson, Farabow, Garrett & Dunner, L.L.P.

(57) ABSTRACT

An output coding apparatus includes a coder for coding an inputted bitstream to an error correction and/or detection code composed of information bits and check bits; and a bitstream assembling section for assembling an outputted bitstream by inserting a synchronization code at any one of a plurality of synchronization code insertion positions previously determined in the outputted bitstream, arranging the information bits at any desired positions of the bitstream, and by arranging the check bits at positions other than the synchronization code insertion positions in the bitstream. Therefore, when the coding apparatus is combined with a resynchronization method using both an error correction and/or detection code and a synchronization code, it is possible to solve a problem caused by pseudo-synchronization or synchronization-loss pull-out or step-out due to erroneous detection of the synchronization code.

3 Claims, 10 Drawing Sheets

U.S. PATENT DOCUMENTS

| | | | |
|---|---|---|---|
| 4,414,677 A * | 11/1983 | Ive et al. .................... | 375/366 |
| 4,827,339 A | 5/1989 | Wada et al. | |
| 5,117,427 A | 5/1992 | Miyake et al. | |
| 5,121,205 A | 6/1992 | Ng et al. | |
| 5,228,028 A * | 7/1993 | Cucchi et al. ............. | 370/392 |
| 5,247,357 A | 9/1993 | Israelsen | |
| 5,260,783 A * | 11/1993 | Dixit .................... | 375/240.13 |
| 5,285,497 A | 2/1994 | Thatcher, Jr. | |
| 5,321,440 A | 6/1994 | Yanahihara et al. | |
| 5,355,379 A | 10/1994 | Hobson et al. | |
| 5,379,116 A | 1/1995 | Wada et al. | |
| 5,412,484 A | 5/1995 | Yoshikawa | |
| 5,416,787 A | 5/1995 | Kodama et al. | |
| 5,420,640 A | 5/1995 | Munich et al. | |
| 5,440,345 A | 8/1995 | Shimoda | |
| 5,442,390 A * | 8/1995 | Hooper et al. ................ | 725/90 |
| 5,444,490 A | 8/1995 | de With et al. | |
| 5,533,021 A * | 7/1996 | Branstad et al. ............ | 370/396 |
| 5,537,409 A | 7/1996 | Moriyama et al. | |
| 5,537,410 A | 7/1996 | Li | |
| 5,546,399 A | 8/1996 | Shimoda | |
| 5,561,791 A * | 10/1996 | Mendelson et al. ........ | 709/233 |
| 5,566,192 A | 10/1996 | Moon | |
| 5,568,140 A | 10/1996 | Imanishi et al. | |
| 5,568,274 A | 10/1996 | Fujinami et al. | |
| 5,570,132 A | 10/1996 | DeWith et al. | |
| 5,592,518 A | 1/1997 | Davis et al. | |
| 5,612,979 A | 3/1997 | Takano | |
| 5,627,845 A | 5/1997 | Asano et al. | |
| 5,668,810 A | 9/1997 | Cannella, Jr. | |
| 5,757,416 A | 5/1998 | Birch et al. | |
| 5,767,912 A | 6/1998 | Bunting et al. | |
| 5,835,144 A | 11/1998 | Matsumura et al. | |
| 5,862,153 A | 1/1999 | Kikuchi et al. | |
| 5,884,269 A | 3/1999 | Cellier et al. | |
| 6,014,171 A | 1/2000 | Koyanagi et al. | |
| 6,151,334 A | 11/2000 | Kim et al. | |
| 6,249,895 B1 | 6/2001 | Kikuchi et al. | |
| 6,415,398 B1 | 7/2002 | Kikuchi et al. | |
| 6,493,838 B1 | 12/2002 | Kikuchi et al. | |
| 6,571,361 B1 | 5/2003 | Kikuchi et al. | |

FOREIGN PATENT DOCUMENTS

| | | |
|---|---|---|
| EP | 0 651 584 A2 | 5/1995 |
| JP | 63-73786 | 4/1988 |
| JP | 7-38857 | 2/1995 |
| JP | 7-235879 | 9/1995 |

OTHER PUBLICATIONS

Watanabe et al., "Error Resilient Low-bitrate Video Coding for MPEG4," Technical Report of IEICE (1996), 95:37-44.

Wada, "Selective Recovery of Video Packet Loss Using Error Concealment," IEEE Journal on Selected Areas In Communications (Jun. 1989), 7:807-814.

European Search Report for Application No. 06023632.0 dated Mar. 5, 2008.

European Search Report for Application No. 06023631.2 dated Mar. 5, 2008.

European Search Report for Application No. 06023617.1 dated Mar. 5, 2008.

European Search Report for Application No. 06023616.3 dated Mar. 5, 2008.

European Search Report for Application No. 06023621.3 dated Mar. 5, 2008.

European Search Report for Application No. 06023634.6 dated Mar. 5, 2008.

European Search Report for Application No. 06023620.5 dated Mar. 5, 2008.

European Search Report for Application No. 06023630.4 dated Mar. 5, 2008.

European Search Report for Application No. 06023633.8 dated Mar. 5, 2008.

European Search Report for Application No. 06023629.6 dated Mar. 5, 2008.

"Final Text for DIS 11172-1 (Rev. 2): Information Technology: Coding of Moving Pictures and Associated Audio for Digital Storage Media—Part 1—Coding at up to about 1.5 MBIT/S (ISO/IEC JTC 1/SC 29/WG 11 N 0156), Passage Text" JA, Tokyo, ISO, 1992, pp. 1-57, XP002034584.

Chujoh T., et al., Error tolerant very low bitrate video coding (2), Duplicate Transmission for Important Information and Reversible Code, Annual Meeting Of IEICE, vol. D-224, Mar. 11, 1996, p. 12.

Lam Wai-Man, "Self-Synchronizing Variable-Length Codes For Image Transmission," IEEE, Mar. 23, 1992, pp. 477-480.

* cited by examiner

CODING APPARATUS AND DECODING APPARATUS FOR TRANSMISSION/STORAGE OF INFORMATION USING SYNCHRONIZATION CODE

This is a continuation application of U.S. patent application Ser. No. 10/279,109, filed Oct. 24, 2002, now U.S. Pat. No. 7,093,170 which is a divisional application of U.S. patent application Ser. No. 09/580,430, filed May 30, 2000 (now U.S. Pat. No. 6,493,838, issued Dec. 10, 2002), which is a divisional application of U.S. patent application Ser. No. 09/148,164, filed Sep. 4, 1998 (now U.S. Pat. No. 6,249,895, issued Jun. 19, 2001), which is a divisional application of U.S. patent application Ser. No. 08/720,067, filed Sep. 27, 1996 (now U.S. Pat. No. 5,862,153, issued Jan. 19, 1999), all of which are incorporated herein by reference.

BACKGROUND OF THE INVENTION

The present invention relates to a system for transmitting and/or storing information through a medium of high error rate such as radio transmission path, and more specifically to a coding and/or decoding apparatus for coding a bitstream obtained by a high efficiency compression coding to an error correction and/or detection code and for transmitting and/or storing the coded bitstream.

In a system for transmitting audio and/or video signals via radio transmission path after the signals have been compression-coded at a high efficiency to reduce the signal quantity as small as possible, for instance as with the case of radio TV telephone, portable information terminal, digital TV broadcasting system, etc., since the error rate of the transmission path is relatively high, it is important to transmit the obtained bitstream in as high a quality as possible.

When the bitstream is transmitted and/or stored via a medium of high error rate as described above, an error correction code such as BCH code, RS code, convolution code, etc. has been so far widely adopted as means for reducing the error rate. On the other hand, as means for detecting an error on the reception side, an error detecting code such as check sum, CRC, etc. are used. In these error correction and/or error detection methods, error is corrected and/or detected by adding excessive (redundant) bits to information to be transmitted and/or stored in accordance with a prescribed rule and further by checking whether the transmitted and/or stored bitstream abides by the same rule when decoded.

However, in the above-mentioned method such that the bitstream obtained by high efficiency compression coding is further coded to an error correction and/or detection code and then transmitted and/or stored, there exists a problem in that it is difficult to combine this method with a resynchronization method for recovering a synchronization when synchoronization-loss occured due to an erroneous bistream word caused by the transmission and/or storage medium. Here, as the above-mentioned synchronization restoring method, there has been widely used such a method of inserting a unique word (referred to as synchronization code or startcode) decodable uniquely (unconditionally) and of resuming decoding operation, in case of synchronization-loss, from a time point when the synchronization code is detected again.

In order to form the synchronization code as a code word decodable unequivocally, it is necessary to construct the code word in combination with another code word in such a way that a bit pattern the same as that of the synchronization code will not appear. In the case of the general error correction and/or detection coding method, however, it is difficult to construct the code word in such a way that a specific bit pattern will not appear. On the other hand, when the bit pattern the same as the synchronization code appear, pseudo-synchronization may occur due to an erroneous detection of the synchronization code.

To overcome this problem, conventionally, the following method has been so far used: after the error correction and/or detection coding has been executed, the presence of the bit pattern the same as that of the synchronization code is checked in the bitstream; when the same bit pattern exists, stuffing bits are inserted into the pattern in accordance with a prescribed rule; and the inserted stuffing bits are removed in accordance with the same prescribed rule by the decoding apparatus in order to prevent the pseudo-synchronization. In this method, however, when the bitstream having an error is transmitted and/or stored, since there exists a possibility that the stuffing bits are also inserted erroneously, there still exists another problem in that an additional synchronization-loss or pseudo-synchronization may occur.

Further, when the bitstream is coded for error correction and/or detection and further the synchronization code is inserted, in the conventional method, since many insertion bits must be added to the bitstream at the last portion of a synchronization block sandwiched between two synchronization codes in order to compensate for a remainder of the information bits to be coded for error correction and/or detection, there arises another problem in that the coding efficiency is lowered.

On the other hand, in order to increase the error correction and/or detection capability, although it may be considered to increase the redundancy of the information to be transmitted and/or stored, in this case, however, the number of necessary bits increases when the same quantity of the information is transmitted. Therefore, when the error correction and/or detection capability is simply increased, there arises another problem in that a transmission path of higher transmission rate is required or that the number of bits of information to be stored is increased. Further, when the transmission rate or the storage capacity is the same, the quantity of information to be transmitted and/or stored decreases with increasing redundancy. As a result, in the case where audio and video information are compression-coded at a high efficiency and then transmitted and/or stored, if the redundancy is simply increased to increase the error resistance, as far as the transmission and/or storage rate is the same, since the information must be compression-coded down to a lesser information quantity, there causes another problem in that the audio quality and picture quality both deteriorate.

To overcome the above-mentioned problems, as the method of obtaining a high error resistance in spite of a lesser redundancy, there exists a method referred to as hierarchical coding. In this method, the audio or picture information compression-coded at a high efficiency is classified according to the degree of error which deteriorates the audio quality or the picture quality; the error correction and/or detection code of a high redundancy and thereby a high error correction and/or detection capability is adopted for the information with more importance and a large error influence; and the error correction and/or detection coding of a low redundancy and thereby a low error correction and/or detection capability is adopted for the information with less importance and a small error influence. In this method, it is possible to increase the error resistance in spite of a relatively small averaged redundancy, as compared with when a correction and/or detection code is used uniformly for all the information in the same redundancy.

For instance, in the case of the coding method such that motion compensation prediction and the orthogonal transform are combined with each other (which is widely adopted for compression-coding moving picture information at high efficiency); that is, in the case of the coding method such that the motion compensation prediction is executed for the inputted moving picture video signals, and the predicted residual is orthogonal-transformed (e.g., discrete cosine transform (DCT)), the error correction and/or detection code of strong error correction and/or detection capability is used for the motion vector information or low-order coefficients of the orthogonal transform coefficients of the prediction residual signals (because these information deteriorates picture quality largely in case an error occurs); and the error correction and/or detection code of weak error correction and/or detection capability is used for high-order coefficients of the orthogonal transform coefficients of the prediction residual signals (because these information exerts a relatively small influence upon the picture quality).

To realize the above-mentioned hierarchical coding, it is necessary to switch the error correction and/or detection codes of different error correction and/or detection capabilities midway in the outputted bitstream. As the method of switching the error correction and/or detection codings of different error correction and/or detection capabilities, there exists such a method that header information indicative of the sort of the error correction and/or detection code is added to the bitstream. FIG. 1 shows an example of a bitstream in which the error correction and/or detection codes are switched by adding header information. In more detail, in this example, two sorts of the error correction and/or detection codes FETC1 and FEC2 are switched. In each of the headers 1101 to 1104, header information indicative of the sort of the error correction and/or detection code and a number of code word is inserted. Therefore, the coding apparatus arranges the code word coded for error correction and/or detection after each header information, and the decoding apparatus decodes the header information; and the decoding apparatus decodes the header information and after that the error correction and/or detection code in accordance with the decoded header information.

However, in the above-mentioned method of switching the error correction and/or detection codes by adding the header information, however, there arises a problem in that the number of bits of the bitstream to be transmitted and/or stored increases due to the addition of the header information. In the case where audio or video signals are compression-coded, since some bits are used for the header information, the number of bits used for the compression-coding audio or video signals is inevitably reduced, with the result that the audio quality and/or the picture quality inevitably deteriorates.

As described above, when the error correction and/or detection coding is executed for a bitstream obtained by compression-coding moving picture signals, since any bit pattern is generated, in the case where the error correction and/or detection coding is combined with the synchronization method using the unique word as synchronization code, there exists a pseudo-synchronization due to erroneous detection of the synchronization code.

Further, when the stuffing bits are inserted to prevent the pseudo-synchronization, there arises another problem in that the synchronization-loss and the pseudo-synchronization occur due to erroneous insertion of the stuffing bits.

Further, when the bitstream is coded for error correction and/or detection and further the synchronization code is inserted, in the conventional method, since a relatively large number of bits must be inserted to compensate for the remainder of the information bits to be coded for error correction and/or detection at the last portion of the synchronization block, there arises a problem in that the coding efficiency deteriorates.

Further, in the case of the coding and/or decoding apparatus in which the error correction and/or detection codes of different error correction and/or detection capabilities are switched by adding header information, since the number of bits to be transmitted and/or stored increases due to the addition of the header information, when audio or video signals are compression-coded at a high efficiency and then transmitted and/or stored, the information quantity used for audio or video information inevitably decreases, with the result there exists a problem in that the audio quality and the video quality both deteriorate.

SUMMARY OF THE INVENTION

With these problems in mind, therefore, it is the first object of the present invention to provide a coding and/or decoding apparatus, which can solve such a problem, as pseudo-synchronization or synchronization-loss, due to erroneous detection of the synchronization code, when combined with the resynchronization method which uses both the error correction and/or detection code and the synchronization code.

Further, the second object of the present invention is to provide a coding and/or decoding apparatus, which can increase the coding efficiency by reducing the number of bits inserted at the last portion of the synchronization block, when combined with the resynchronization method which uses both the error correction and/or detection code and the synchronization code.

Further, the third object of the present invention is to provide a coding and/or decoding apparatus, which can improve the information quality by reducing the number of bits of the bitstream to be transmitted and/or stored, without adding header information indicative of the sort of the error correction and/or detection code, in the case is when bitstream obtained by compression-coding audio and video signals are coded by switching a plurality of sorts of error correction and/or detection codes and then transmitted and/or stored.

To achieve the above-mentioned object, the first aspect of the coding apparatus according to the present invention provides a coding apparatus, comprising: coding means for coding an inputted bitstream to an error correction and/or detection code composed of information bits and check bits; and bitstream assembling means for assembling an outputted bitstream by inserting a synchronization code at any one of a plurality of synchronization code insertion positions previously determined in the outputted bitstream, arranging the information bits at any desired positions of the bitstream and by arranging the check bits at positions other than the synchronization code insertion positions in the bitstream.

Further, the first aspect of the present invention provides a decoding apparatus, comprising: synchronization code detecting means for detecting a synchronization code from a bitstream coded to an error correction and/or detection code composed of information bits and check bits, at each of a plurality of previously determined synchronization code insertion positions thereof; bitstream disassembling means for disassembling the bitstream to extract the information bits of the error correction and/or detection code and the check bits of the error correction and/or detection code arranged at positions other than the synchronization code insertion positions; and decoding means for decoding the error correction and/or detection code on the basis of the information bits and the check bits extracted by said code disassembling means.

In the first aspect of the present invention, since the synchronization code is arranged at each of a plurality of predetermined synchronization code insertion positions in the output bitstream and further since the check bits of the error correction and/or detection code are arranged at positions other than the synchronization code insertion positions, even if the bit pattern the same as that of the synchronization code is included in the check bits, there exists no possibility that the synchronization code is detected erroneously. Therefore, it is unnecessary to use a specific error correction and/or detection code to prevent a specific bit pattern form being formed or to insert bits to protect the synchronization pattern after having been coded to the error correction and/or detection code. As a result, it is possible to increase not only the degree of freedom of selection of the usable error correction and/or detection codes but also to improve the resistance against error, because there exists no possibility that the new erroneous synchronization detection occurs due to mixture of the erroneous insertion bit.

Further, the second aspect of the present invention provides a coding apparatus, comprising: bitstream converting means for converting an inputted bitstream other than a synchronization code arranged at each of a plurality of synchronization code insertion positions previously determined in an outputted bitstream, in such a way that a Hamming distance from the synchronization code exceeds a predetermined value; coding means for coding the bitstream converted by said bitstream converting means to an error correction and/or detection code composed of information bits and check bits; and bitstream assembling means for assembling an outputted bitstream by inserting a synchronization code at any one of a plurality of the synchronization code insertion positions previously determined in the outputted bitstream, arranging the information bits at any desired positions of the bitstream, and by arranging the check bits at positions other than the synchronization code insertion positions in the bitstream.

Further, the second aspect of the present invention provides a decoding apparatus, comprising: synchronization code detecting means for detecting a synchronization code at each of previously determined synchronization code insertion positions, from a bitstream coded to an error correction and/or detection code composed of information bits and check bits and further including the inserted synchronization codes; bitstream disassembling means for disassembling the bitstream, to extract the information bits of the error correction and/or detection code and the check bits of the error correction and/or detection code arranged at positions other than the synchronization code insertion positions; decoding means for decoding the error correction and/or detection code on the basis of the information bits and the check bits extracted by said code disassembling means; and bitstream converting means for converting the bitstream other than the synchronization code arranged at each of the synchronization code insertion positions, which is decoded by said decoding means and further converted in such a way that a Hamming distance from the synchronization code in the bitstream exceeds a predetermined value, to the original bitstream.

In the second aspect of the present invention, since the bit train arranged at the synchronization code insertion position is converted in such a way that the Hamming distance from the synchronization code exceeds a predetermined value and further since the bit train is reversely converted by the decoding processing, the bit pattern the same as that of the synchronization code will not be included in the bit train, so that it is possible to prevent the erroneous detection of the synchronization code. Further, when the bit train is converted in such a way that the Hamming distance between the synchronization code and the bitstream other than the synchronization code exceeds a predetermined value, even if an error is mixed with the bitstream, since the synchronization code can be discriminated from the bitstream other than the synchronization code, it is possible to reduce the possibility that the synchronization code is detected erroneously.

Further, since the above-mentioned conversion and/or reverse conversion processing is executed at the synchronization code insertion positions, it is possible to reduce the overhead, as compared with the prior art method such that the conversion and/or reverse conversion processing is executed all over the bitstream. In addition, in the case of the bitstream inputted to the coding apparatus, it is unnecessary to execute the conversion processing or to use a special code word, so that the bit pattern the same as that of the synchronization code can be prevented from being formed. In particular, in the case where a variable code length coding apparatus in which different code word tables are switched in use is connected to the input side of the coding apparatus according to the present invention, when the code word table is formed in such a way that the bit pattern the same as that of the synchronization code will not be formed by the variable length coding apparatus, there exists a problem in that the coding efficiency is inevitably reduced. In the present invention, however, since the coding apparatus and/or decoding apparatus as described above is used, it is possible to eliminate this problem.

Further, the third aspect of the present invention provides a coding apparatus, comprising: coding means for coding an inputted bitstream to an error correction and/or detection code; synchronization code inserting means for inserting synchronization codes into the inputted bitstream; deciding means for deciding the number of information bits to be coded to the error correction and/or detection code and arranged immediately before the synchronization code of the bitstream; and said coding means forming the error correction and/or detection code arranged immediately before the synchronization code as a degenerative code adaptively degenerated on the basis of the number of bits decided by said deciding means.

Further, the third aspect of the present invention provides a decoding apparatus, comprising: decoding means for decoding a bitstream coded to an error correction and/or detection code and further including inserted synchronization codes; synchronization code detecting means for detecting the synchronization codes arranged in the bitstream; deciding means for deciding the number of information bits coded to the error correction and/or detection code and arranged immediately before the synchronization code detected by said synchronization code detecting means; and said decoding means decoding the bitstream by deciding whether the error correction and/or detection code arranged immediately before the synchronization code is a degenerative code or not on the basis of the number of the information bits decided by said deciding means.

In the third aspect of the present invention, since a degenerative code (whose number of bits is degenerated to, a small number of bits required to code the information bits remaining at the last portion of the one synchronization period (block) is used for the error correction and/or detection code arranged immediately before the synchronization code, it is unnecessary to use many insertion bits to fill the remainder of the information bits at the last portion of the synchronization block, with the result that the coding efficiency can be increased.

Further, the fourth aspect of the present invention provides a coding apparatus, comprising: coding means for coding an inputted bitstream including a plurality of sorts of information to different error correction and/or detection codes; and switching means for switching the sorts of the error correction and/or detection codes according to the sort of the information included in the bitstream.

Further, the fourth aspect of the present invention provides a decoding apparatus, comprising: decoding means for decoding a bitstream coded to error correction and/or detection codes of different sorts according to information sort, to form original information; and means for deciding the sort of the error correction and/or detection code on the basis of the information sort formed by said decoding means, the decided sort being transmitted to said decoding means.

In the fourth aspect of the present invention, when the coding and/or decoding is executed by switching the error correction and/or detection codes according to the sort thereof, since the error correction and/or detection code is switched on the coding apparatus side according to the sort of information of the bitstream inputted to the coding apparatus, and since the error correction and/or detection code is switched on the decoding apparatus side by deciding the sort of the error correction and/or detection code on the basis of the decoded information (i.e., the same code as that used on the coding side), any header information indicative of the sort of the error correction and/or detection code is not required (being different from the prior art method), so that it is possible to eliminate the overhead due to the header information.

DETAILED DESCRIPTION OF THE PREFERRED EMBODIMENTS

Embodiments of the present invention will be described hereinbelow with reference to the attached drawings.

Figure 1:
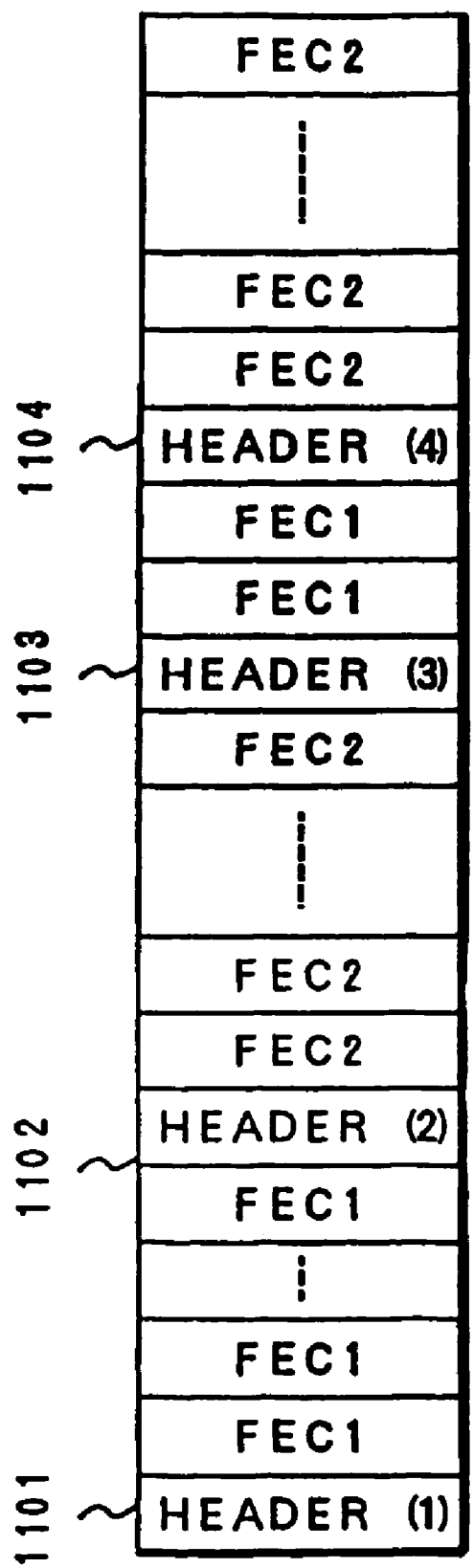
FIG. 1 is an illustration showing an example of a bitstream obtained by the prior art error correction and/or detection code switch coding apparatus.
Figure 2:
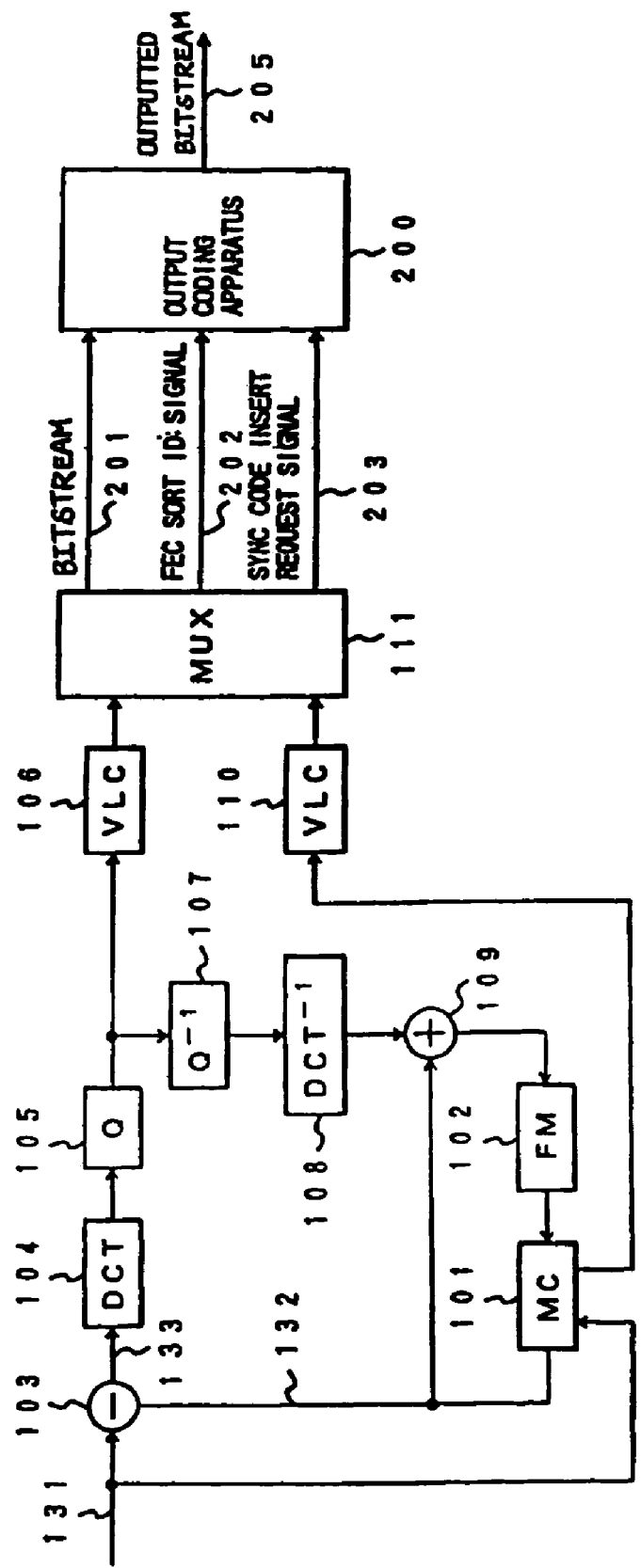
FIG. 2 is a block diagram showing an embodiment of the moving picture compression coding apparatus according to the present invention.

FIG. 2 is a block diagram showing an embodiment of the moving picture coding apparatus provided with an error correction and/or detection switching function according to the present invention, which is combined with a compression coding apparatus using motion compensation adaptive prediction and discrete cosine transform coding (one of orthogonal transform codings). Here, the coding method in which both the motion compensation adaptive prediction and discrete cosine transform coding are combined with each other is disclosed in detail by Document: by Hiroshi YASUDA, "International Standard of Multimedia Coding", published by Maruzen, June 1991, for instance. Therefore, only the operation thereof will be briefly explained hereinbelow. Further, as the error correction and/or detection code used in this embodiment, such a code as the BCH code in which the information bits are separated from the check bits is assumed to be used.

In FIG. 2, moving picture signals 131 to be coded are inputted in unit of frame. The inputted moving picture signals 131 are processed for motion compensation adaptive prediction in unit of small region (e.g., macro block). In more detail, a motion vector between inputted moving picture signals 131 and video signals already coded and locally decoded and further stored in a frame memory is detected by a motion compensation adaptive predictor 101. Further, predicted signals 132 are formed by compensation prediction on the basis of the detected motion vector. In this motion compensation predictor 101, a preferable prediction mode to be used for coding is selected from both the motion compensation prediction coding and the intra-frame coding (the inputted moving picture signal 131 is coded as it is without forming any prediction signal), and the prediction signals corresponding to the selected mode are outputted.

The outputted prediction signals are inputted to a subtracter 103, and prediction residual signals 133 obtained by subtracting the prediction signals 132 from the inputted moving picture signals 131 are outputted. The outputted prediction residual signals 133 are discrete-cosine transformed (DCTed) in unit of constant size block by a discrete cosine transform section 104, so that DCT coefficients can be formed. The formed DCT coefficients are quantized by a quantizer 105. The DCT coefficient signals quantized by the quantizer 105 are branched into two. One is variable-length coded by a first variable length coder 106. Further, the other is dequantized by a dequantizer 107, and further reversely discrete-cosine transformed by a inverse discrete cosine transform section 108. The output of the inverse discrete cosine transform section 108 is added to a application signal 132 by an adder 109 to form local decoded signals. The formed local decoded signals are stored in a frame memory 102.

On the other hand, the prediction mode and the motion vector information decided by the motion compensation adaptive predictor 101 are variable-length coded by a second variable length coder 110. The variable length codes outputted by the first and the second variable length coders 106 and 110 are multiplexed by a multiplexer 111.

From the multiplexer 111, a bitstream 201 of the multiplexed variable length codes, an FEC sort ID (identification) signal 202 indicative of a sort of the corresponding error correction and/or detection code, and a synchronization code insertion request signal 203 for requesting an insertion of a synchronization code is outputted.

These signals of the bitstream 202, the FEC sort ID signal 202, and the synchronization code insertion request signal 203 are inputted to an output coding apparatus 200. The output coding apparatus 200 codes the bitstream 201 by switching a plurality of error correction and/or detection codes of different sorts, to form a final output bitstream 205.

Here, the output coding apparatus 200 corresponds to the coding apparatus according to the present invention.

Figure 3:
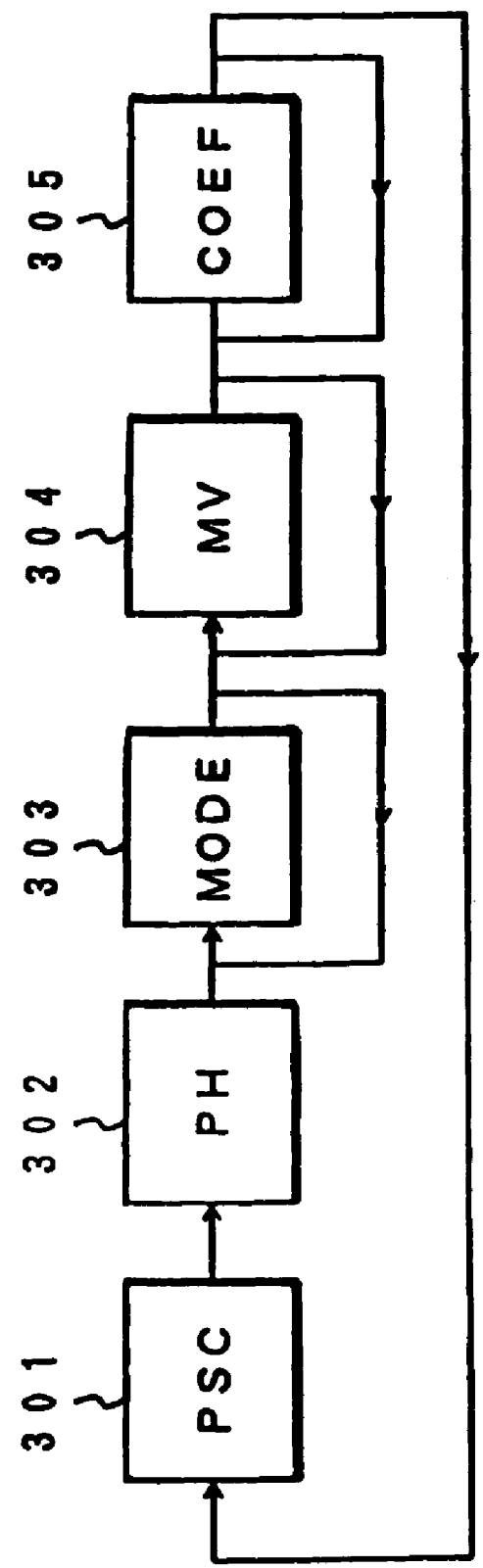
FIG. 3 is a diagram for assistance in explaining the multiplexing syntax adopted by a multiplexer of the moving picture compression coding apparatus shown in FIG. 2.

FIG. 3 shows a flow of signals multiplexed by the multiplexer 111. Here, the multiplexing is executed in unit frame to be coded. First, the picture synchronization code 301 is multiplexed. When the picture synchronization code 301 is multiplexed, the synchronization code insertion request signal 203 is outputted from the multiplexer 111 to the coding apparatus 200, so that the coding apparatus 200 can know that the multiplexed code word is a synchronization code. Successively, a picture header 302 indicative of one of various coding modes of the coded frame is multiplexed upon the bitstream 201. Further, prediction mode information 303 indicative of the prediction mode of the motion compensation adaptive predictor MC at each region is multiplexed. Further, motion vector information 304 and the DCT coefficients (referred to as residual DCT coefficients) 305 of the prediction residual signals are multiplexed. Here, when the picture header 302, the prediction mode information 303, the motion vector information 304, and the residual DCT coefficients 305 are multiplexed, the FEC sort ID signal 202 indicative of the sort of the error correction and/or detection code is outputted in correspondence to each of the multiplexed signals.

Here, an error correction and/or detection code of high correction and/or detection capability is used for the picture header 302, the prediction mode information 303 and the motion vector information 303, because these information deteriorate picture quality largely when an error is mixed therewith. On the other hand, in the case of the residual DCT coefficients 305, even if error is mixed therewith, since the picture quality can be prevented from being deteriorated largely by detecting the error and by setting the residual to zero, an error correction and/or detection code of high correction and/or detection capability is not used; that is, it is sufficient to detect only an error of the residual DCT coefficients 305.

Figure 4:
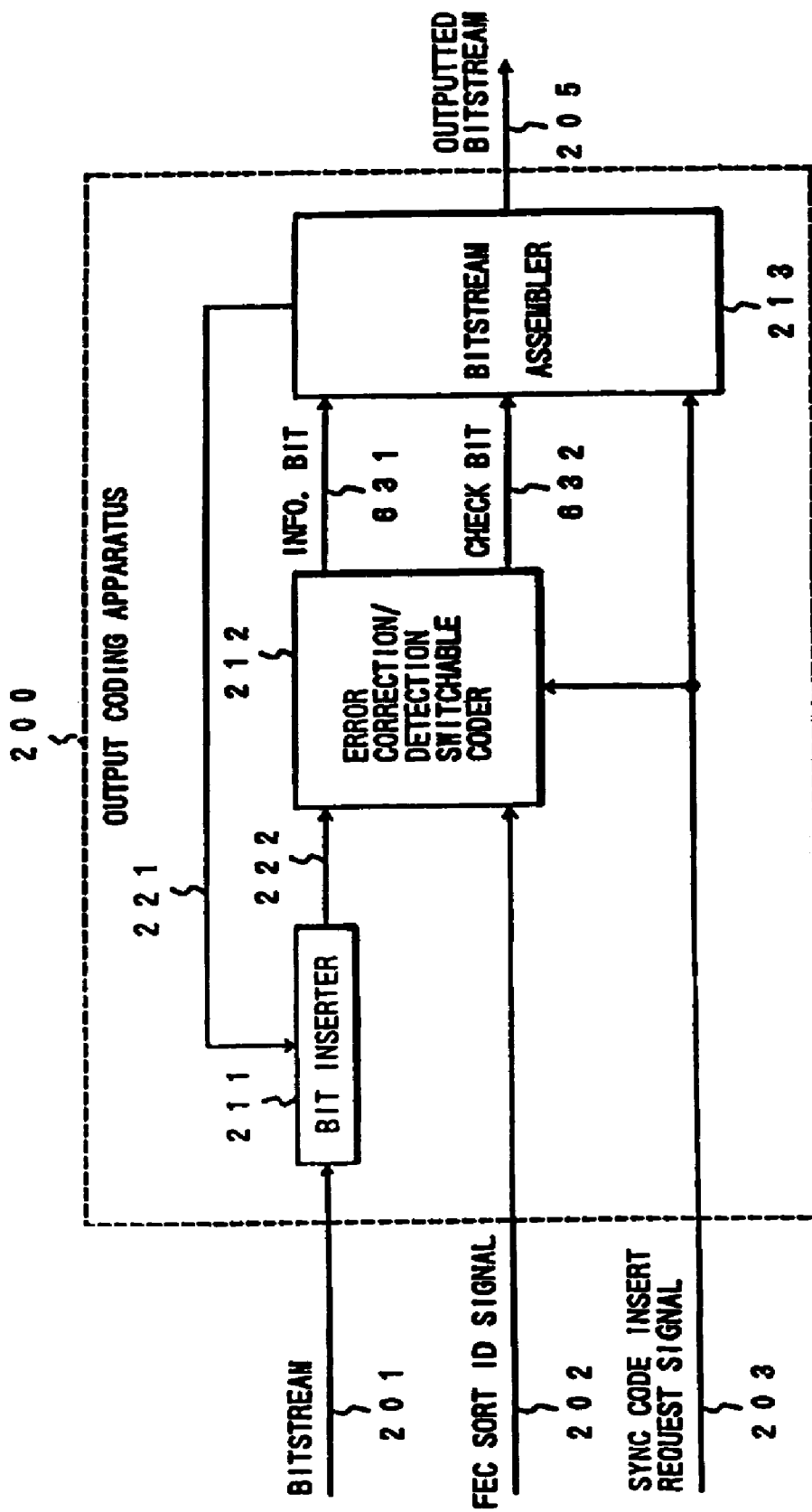
FIG. 4 is a block diagram showing an output coding apparatus of the moving picture compression coding apparatus shown in FIG. 2.
Figure 5:
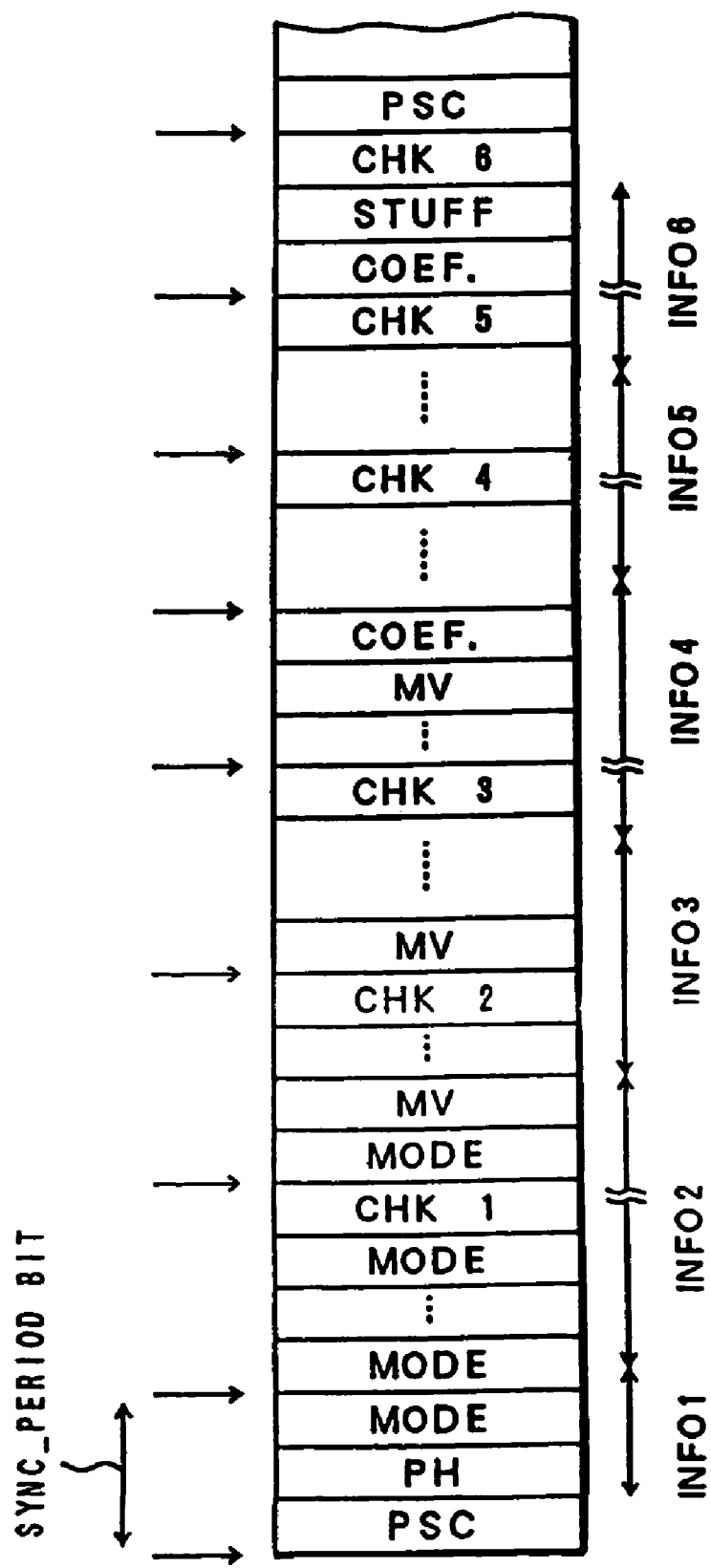
FIG. 5 is an illustration showing an example of an outputted bitstream outputted by the moving picture compression coding apparatus shown in FIG. 2.

FIG. 4 is a block diagram showing the output coding apparatus 200 shown in FIG. 2. The output coding apparatus 200 is composed of a bit inserter 211, an error correction and/or detection switching coder 212, and a bitstream assembler 213. Further, FIG. 5 shows an example of the output bitstream 205 formed by the output coding apparatus 200. The bitstream 205 is composed of a picture synchronization code PSC, a picture header PH, prediction mode information MODE, motion vectors MV, error correction and/or detection code check bits CHK, residual DCT coefficients COEF, and stuffing (insertion) bits STUFF. The output bitstream 205 has the following features.

(1) The picture synchronization code PSC is inserted into any one of the synchronization code insertion positions as shown by arrows arranged at constant intervals (for each sync_period bits). The length of the sync_period is determined larger than the maximum length of the synchronization code PSC and the maximum length of the check bit CHK. Further, the check bits CHK are arranged each being shifted so as to be arranged immediately before the synchronization code insertion position.

(2) The error correction and/or detection code arranged at the last portion of one frame (i.e., at the last portion of one synchronization period sandwiched between the two synchronization codes PSC) is a punctured code such that only the finally remaining information bits are coded. Further, in order to shift the position of the check bit CHIC (e.g., the check bit CHK6 in the example shown in FIG. 5) a necessary number of the stuffing bites STUFF are inserted.

(3) The FEC sort ID signal indicative of the sort and the number of the error correction and/or detection codes is not arranged n the output bitstream 205 shown in FIG. 5.

In the output bitstream 205 as shown in FIG. 5, since the positions of the check bits CHIC are shifted as explained in item (1) above, the check bit CHIC is not inserted at any of the synchronization code insertion positions shown by the arrows in FIG. 5, with the result that there exists no possibility that the pseudo-synchronization occurs by the check bits CHK. Further, in the case of the error correction and/or detection coding at the last of the frame, although many stuffing bits must be inserted at the last of the frame in the prior art method, since the punctured code is used for the last of the frame as explained by item (2) above, it is possible to reduce the number of the insertion (stuffing) bits. In addition, since the header information indicative of the sort and the number of error correction and/or detection code is not included in the output bitstream 205, as explained by item (3) above, it is possible to reduce the code quantity for the header information.

The construction and the operation of the output coding apparatus 200 (shown in FIG. 4) for forming the output bitstream 205 will be described in more detail hereinbelow in relation between the bitstream 201 shown in FIG. 3 outputted by the multiplexer 111 and the output bitstream 205 shown in FIG. 5.

Figure 6:
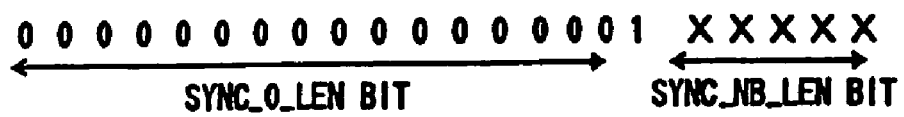
FIG. 6 is an illustration showing an example of a synchronization code.

When the synchronization code 301 is multiplexed by the multiplexer 111, the synchronization code insertion request signal 203 is outputted as already explained. Here, the synchronization code 301 is composed of sync_0_len bits of "0", one bit of "1", and sync_nb_len bits of "xxxxx" indicative of the sort of the synchronization code 301, as shown in FIG. 6. In response to the synchronization code 301 and the synchronization code insertion request signal 203 outputted by the multiplexer 111, the output coding apparatus 200 outputs the synchronization code (PSC) of the output bitstream 205 from the bitstream assembler 213.

Here, as shown in FIG. 5, since the synchronization code 301 (PSC) can be inserted at only the synchronization code insertion positions arranged at sync_period intervals of the output bitstream 205, when the last position of the output bitstream 205 already formed is not arranged at the synchronization code insertion position, the stuffing bits STUFF (as described later) are inserted in such a way that the synchronization code 301 can be arranged at the synchronization code insertion position.

After the synchronization code 301 has been outputted to the output bitstream 205, the picture header 302, the prediction mode information 303, the motion vector information 304, and the residual DCT coefficients 305 are coded as follows: First, bits are inserted into the bitstream 201 outputted by the multiplexer 111 by the bit inserter 211 in order to prevent the generation of the pseudo-synchronization. In other words, when a bit pattern the same as that of the code word of the synchronization code 301 exists in the output bitstream 205, since the synchronization code 301 cannot be decoded unequivocally, bits are inserted according to the necessity. For instance, if the synchronization code 301 is a code word in which the sync_0_len bits of "0" are arranged continuously as shown in FIG. 6, it is possible to prevent the pseudo-synchronization by inserting "1" in such a way, that "0" will not be continued beyond the sync_0_len bits in the bitstream, except at the synchronization code 301.

Here, since the synchronization code 301 is inserted at only the synchronization code insertion position as already explained, it is sufficient when the bit "1" is inserted at only the synchronization insertion positions, respectively for prevention of the pseudo-synchronization. Here, a count value 221 indicative of the total number of bits of the output bitstream 205 so far formed is outputted by the bitstream assembler 213, and further the bit inserter 211 decides as to whether further bit insertion is necessary or not on the basis of the count value 221 of the bit inserter 211. Here, when the count value 221, that is, the total bit number of the output bitstream 205 so far formed is denoted by total_len, the number of "1" in the bitstream 201 is counted in a bit block (interval) of $$0 < \text{total\_len mod sync\_period} \leq \text{sync\_0\_len}$$

where A mod B denotes a remainder obtained when A is divided by B.

Here, if there exists no bit of "1" in this bit interval, one bit of "1" is inserted.

Further, in order to reduce the possibility that the synchronization code 301 is detected erroneously, bit are inserted as follows:

Here, in order to detect the synchronization code 301 even if an n-bit error is mixed with the synchronization code 301, it is necessary to decide the code word having a Hamming distance less than n from the true synchronization code, as the synchronization code, by use of an input decoding apparatus of the moving picture decoding apparatus (described later). In this case, however, if the above-mentioned decision is made by leaving the bitstream other than the synchronization code 301 as it is, since there exists the case where a bit pattern having a Hamming distance less than n exists in the bitstream other than the synchronization code 301, when existing at the synchronization code insertion position, this bit pattern is erroneously decided as the synchronization code 301.

To overcome this problem, the bit inserter 211 inserts bits into the bitstream 201 as follows: the bitstream other than the synchronization code arranged at each of the synchronization code insertion positions in the bitstream 201 is converted in such a way that the Hamming distance thereof from the synchronization code 301 becomes a value larger than $2*n+1$. In more detail, the number (=n0) of "1" is counted in the bit block (interval) of $$0 < \text{total\_len mod sync\_period} \leq \text{sync\_0\_len} - (2*N+1)$$

Here, if n0 is less than $(2*N+1)$, $\{(2*n+1)-n0\}$ bits of "1" are inserted into the bitstream 201.

Figure 7:
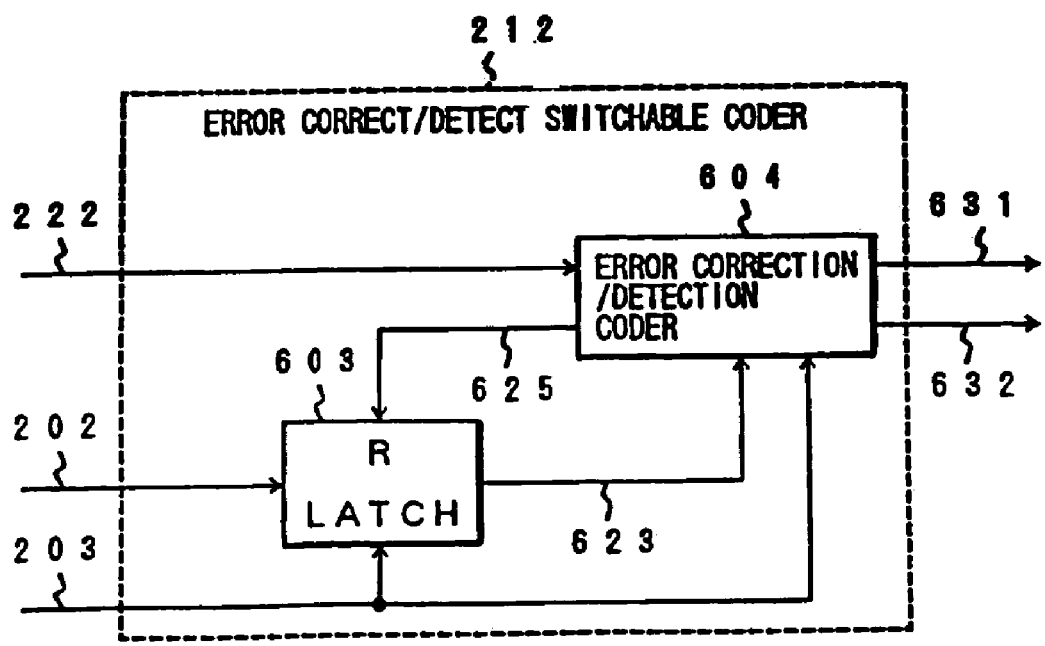
FIG. 7 is a block diagram showing the error correction and/or detection switching coder of the output coding apparatus shown in FIG. 4.

After the bits have been inserted by the bit inserter 211 as described above, the bitstream 222 is inputted to the error correction and/or detection code switching coder 212, together with he FEC sort ID signal 202 indicative of the sort of the error correction and/or detection code FIG. 7 is a block diagram showing the error correction and/or detection code switching coder 212 shown in FIG. 4. A latch circuit 603 is a circuit for latching the FEC sort ID signal 202, after the synchronization code has been outputted from the multiplexer 111 to the bitstream 201 and further the synchronization code insertion request signal 203 has been outputted. The latched signal 623 is supplied to an error correction and/or detection coder 604.

The error correction and/or detection coder 604 codes the bitstream 222 supplied by the bit inserter 211 for error correction and/or detection in accordance with the latched signal 623; that is, forms and outputs the information bits 631 and check bits 632, respectively. Further, after the error correction and/or detection coding for one block has been completed, the error correction and/or detection coder 604 outputs a latch command signal 625 for commanding the latch circuit 603 to latch the succeeding FEC sort ID signal 202. Therefore, on the basis of this latch command signal 625, the latch circuit 603 latches the succeeding FEC sort ID signal 202 and supplies the latched signal to the error correction and/or detection coder 604 again.

By repeating the above-mentioned operation, the output coding apparatus 200 codes the bitstream 222 (to which bits have been already inserted by the bit inserter 211) for error correction and/or detection, by switching the error correction and/or detection codes by the error correction and/or detection switching coder 212 in accordance with the FEC sort ID signal 202 supplied by the multiplexer 111. Here, since the FEC sort ID signal 202 can be latched by the latch circuit 603 only when the error correction and/or detection coding of one block has been completed, the same error correction and/or detection code is kept applied until the FEC sort ID signal 202 is switched. For instance, in the case where the error correction and/or detection code of FEC1 is used for the picture header 302 and the code of FEC2 is used for the prediction mode information 303, if the number of bits of the picture header 302 is shorter than that of the one-block information of FEC1, the FEC1 code is kept used for the error correction and/or detection code of the succeeding prediction mode information 303 until reaching the bit number of FEC1 information.

Figure 8:
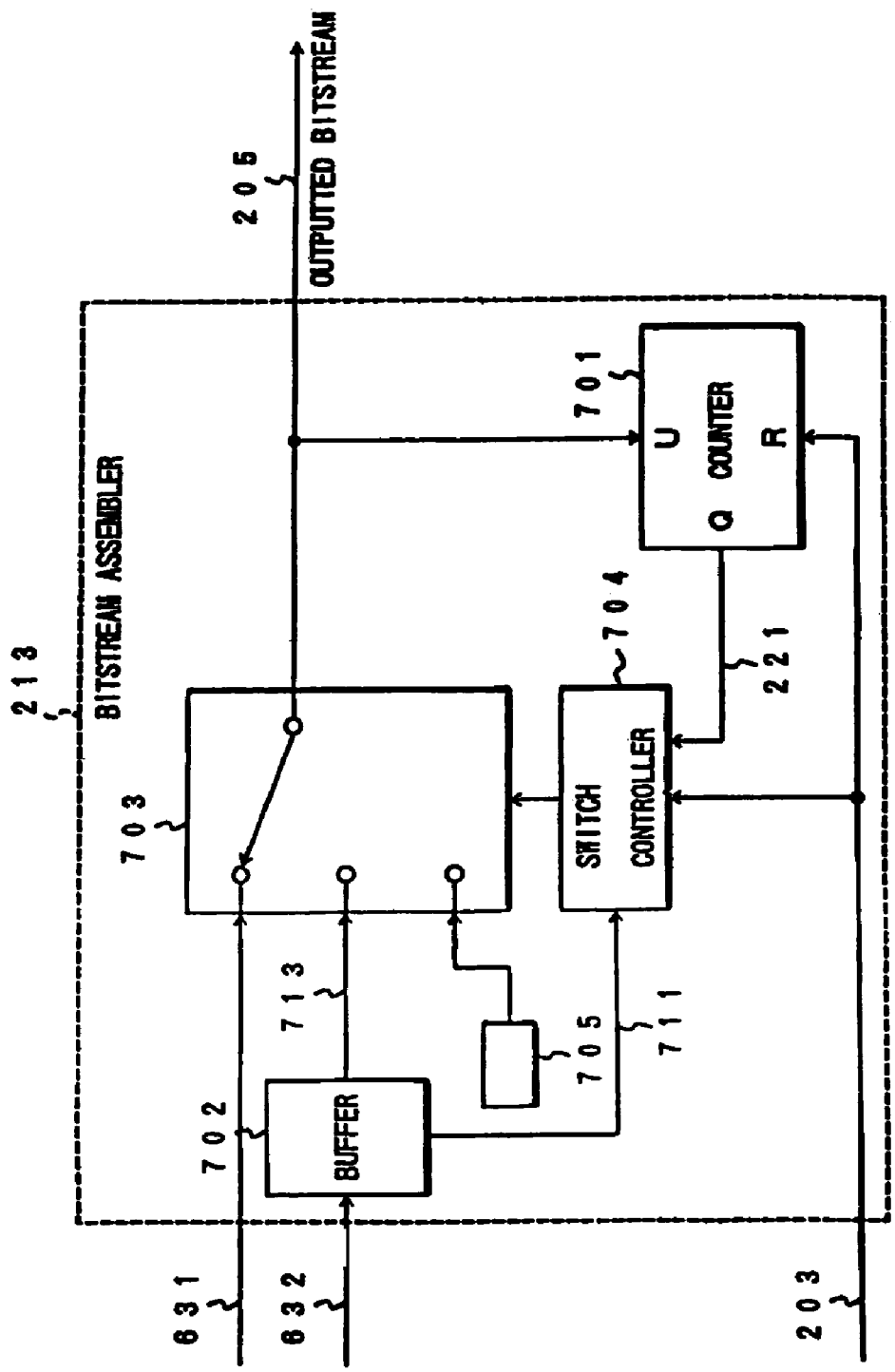
FIG. 8 is a block diagram showing the bitstream assembler of the output coding apparatus shown in FIG. 4.

FIG. 8 is a block diagram showing the bitstream assembler 213 shown in FIG. 4. The bitstream assembler 213 is composed of a counter 701 for counting the number of bits of the output bitstream 205, a buffer 702 for storing the check bits 632 and the number of bits thereof temporarily, a switch 703 for switching the output bitstream 205, and a switch controller 704 for controlling the switch 703. When the synchronization code request signal 203 is inputted to the bitstream assembler 213, the counter 701 is reset to a synchronization code length value sync_len, and counts up bits in sequence beginning from a bit just after the synchronization code until, the succeeding synchronization code is inputted. Here, after the synchronization code has bee inputted, the switch 703 is activated in such a way that the information bits 631 can be kept outputted until the first check bit 632 is inputted. When the check bit 632 is inputted, the check bit 632 is stored in the buffer 702, and the number of bits (check bit number) 711 is outputted from the buffer 702 to the switch controller 704.

On the basis of the check bit number 711 and the count value 221 of the counter 701, the switch controller 704 controls the switch 703 to shift the check bit, that is, in such a way that the check bit 632 will not be outputted to the synchronization code insertion position, as already explained. For instance, when the count value 221 is denoted by bit_count and the check bit number 711 is denoted by check_len, if $$\text{bit\_count mod sync\_period} < \text{sync\_period} - \text{check\_len}$$

information bits 631 are outputted, and if $$\text{sync\_period} - \text{check\_len} \leq \text{total\_bits mod}$$
$$\text{sync\_period} < \text{sync\_period}$$

the check bits 713 stored in the buffer 702 are outputted. After that, the above-mentioned processing is repeated by inputting the information bits 631 and the check bits 632.

Here, as already explained, since the output coding apparatus 200 uses the punctured code at the last portion of each frame as the error correction and/or detection code and further shifts the check bit position for bit insertion, the operation is somewhat different from the ordinary operation. In more detail, after having outputted the one-frame bitstream 201, the multiplexer 111 first outputs the synchronization code insertion request signal 203 for the succeeding frame. In correspondence thereto, the error correction and/or detection coder 604 of the error correction and/or detection switching coder 212 shown in FIG. 7 regards the insufficient portion of the information bits 631 of the error correction and/or detection code, as a bit pattern previously determined and outputted by an insertion (stuffing) bit generator 705, and forms the error correction and detection code by use of the redundant code. Here, the bit pattern can be composed of only bits of "1" or "0" or a repetition of a specific pattern as "010101 . . . ".

After having outputted the last bit of the information bits 631, in the bitstream assembler 213 shown in FIG. 8, the switch 703 is switched from the bit generator 705 to the input side, to insert the insertion (stuffing) bit in such a way that the check bit 713 stored in the buffer 702 can be arranged just before the succeeding synchronization code. Here, when the count value 221 of the counter 701 obtained when the last information bit 631 of one frame has been outputted is denoted by total_len and the number of bits of the check bits 632 outputted lastly is denoted by last_check_len, the number of the insertion bits stuffing_len can be expressed as $$\text{stuffing\_len} = \text{sync\_period} - \text{last\_check\_len} - (\text{total\_len} \mod \text{sync\_period}).$$

Further, when the degenerative code is not used, the insufficient portion (info_len−last_info_len) from the normal information bits info_len in the last information bits last_info_len are inserted. In addition, bits must be inserted in order to shift the check bits. As a result, as compared with when the redundant code is used, it is necessary to insert the following additional bits as $$\text{info\_len} - \text{last\_info\_len} + (\text{info\_len} - \text{last\_info\_len}) \mod \text{sync\_period}$$

After having outputted the information bits 631 and the insertion bits to the output bitstream 205 through the switch 703, the bitstream assembler 213 is lastly switched to the check bits 731, and outputs the switched check bits 713 to the output bitstream 205.

The moving picture decoding apparatus according to the present invention will be described hereinbelow.

Figure 9:
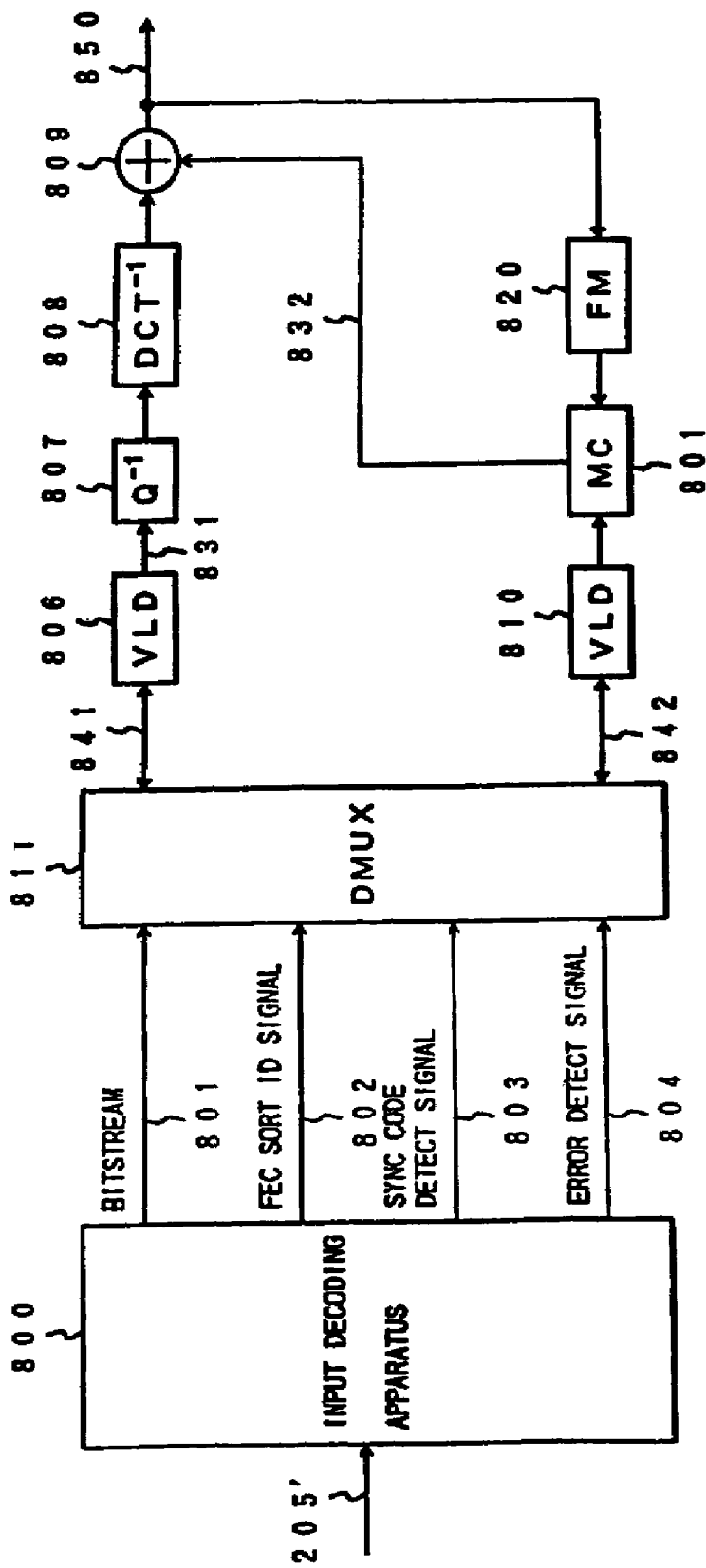
FIG. 9 is a block diagram showing an embodiment of the moving picture compression decoding apparatus according to the present invention.

FIG. 9 is a block diagram showing the moving picture decoding apparatus which corresponds to the moving picture coding apparatus shown in FIG. 2. After having been passed through a transmission and/or storage system, the output bitstream 205 outputted by the moving picture coding apparatus shown in FIG. 2 is inputted to an input decoding apparatus 800 as an input bitstream 205'. In the present invention, the input decoding apparatus 800 corresponds to the output decoding apparatus 200 according to the present invention.

The input decoding apparatus 800 outputs a bitstream 801 obtained by decoding the error correction and/or detection code, a synchronization code detection signal 803, and an error detection signal 804, by switching the error correction and/or detection code on the basis of an FEC sort ID signal 802 indicative of the sort of the error correction and/or detection signal applied by the demultiplexer 811. That is, the demultiplexer 811 inputs the bitstream 801, the synchronization code detection signal 803, and the error detection signal 804, and outputs a prediction residual signal 841 and a motion compensation adaptive prediction information code 842, separately.

The prediction residual code 841 is inputted to the first variable length decoder 806, and the motion compensation adaptive prediction information code 842 is inputted to a second variable length decoder 810. Residual DCT coefficients 831 decoded by the first variable length decoder 806 are dequantized by a dequantizer 807, inverse-DCTed by a inverse DCT section 808, added to a motion compensation adaptive prediction signal 832 outputted by a motion compensation adaptive predictor 801 by an adder 809, and then outputted as reconstructed picture signals 850. The reproduced picture signals 850 are outputted from the decoding apparatus and further stored in a frame memory 820. Further, the motion compensation adaptive prediction information decoded by the second variable length decoder 810 is inputted to a motion compensation adaptive predictor 801 to form motion compensation prediction signals 832.

The above-mentioned processing is executed to reproduce moving picture in correspondence to the moving picture coding apparatus shown in FIG. 2. Therefore, the serial processing executed by the dequantizer 807, the inverse DCT section 808, the adder 800 and the frame memory 820 as shown in FIG. 9 is basically the same as the serial processing executed by the dequantizer 107, the inverse DCT section 108, the adder 109 and the frame memory 102 as shown in FIG. 2, although the realizing means are somewhat different from each other. Further, the processing of the first and second variable length decoders 806 and 810, the demultiplexer 811 and the input decoding apparatus 800 are opposite to the processing of the first and second variable length decoders 106 and 110, the multiplexer 111 and the output decoding apparatus 200, respectively, excepting the case where an error injured the bitstream.

Figure 10:
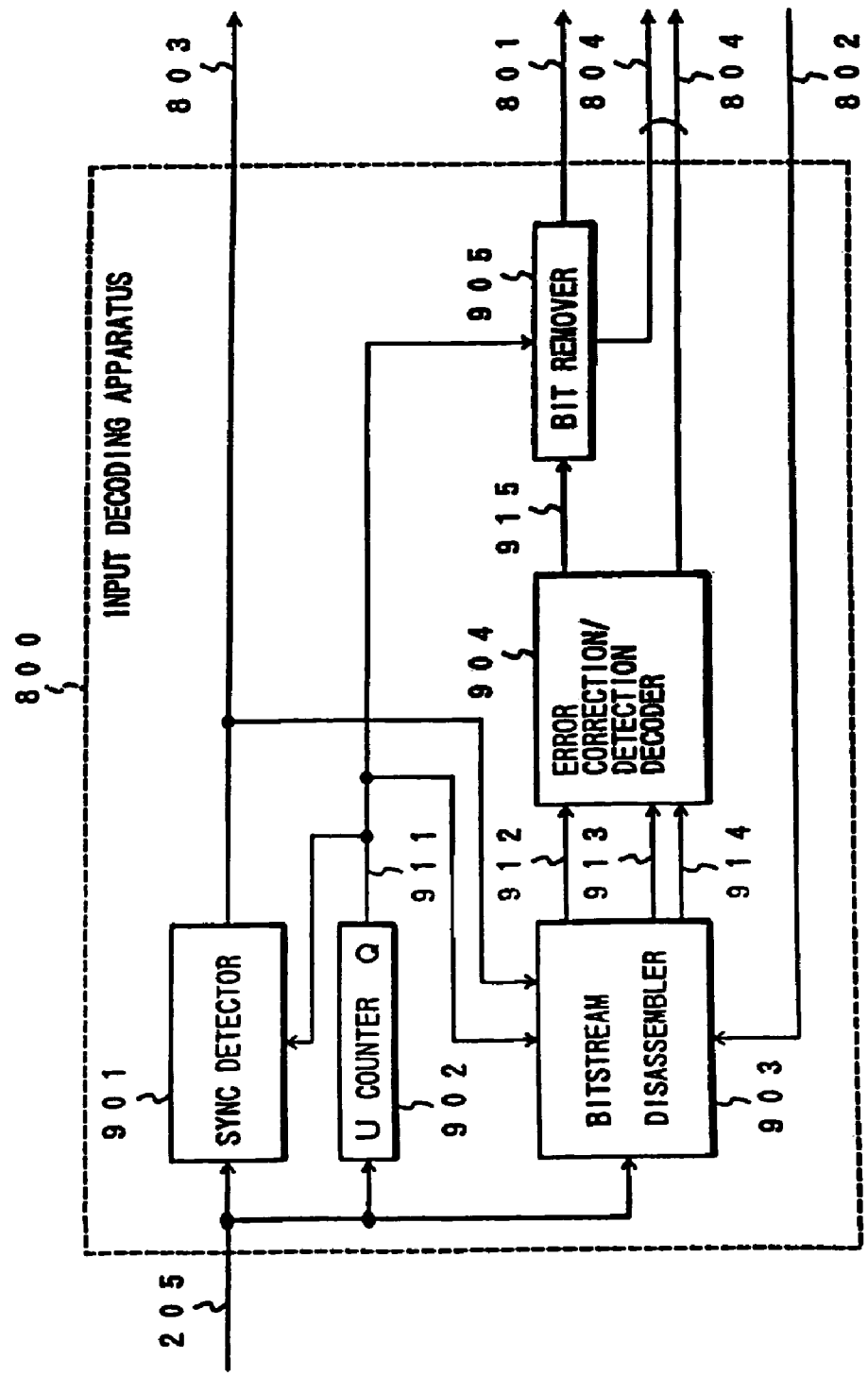
FIG. 10 is a block diagram showing an input decoding apparatus of the moving picture compression decoding apparatus shown in FIG. 9.

FIG. 10 is a block diagram showing the input decoding apparatus 800 shown in FIG. 9. The input decoding apparatus 800 is composed of a synchronization detector 901 for detecting the synchronization code of the input bitstream 205', a counter 902 for counting the number of bits of the input bitstream 205', a bitstream disassembler 903 for disassembling the input bitstream 205' into information bits 912 and check bits 913 and for outputting these-bits separately, an error correction and/or detection decoder 904, and an inserted stuffing bit remover 905.

The synchronization detector 901 detects the synchronization code at only the synchronization code insertion position on the basis of the count value 911 outputted by the counter 902. For instance, when the interval between the two synchronization code insertion positions is denoted by sync_period; the count value 911 is dented by bit_count; and the length of the synchronization code is denoted by sync_len, the synchronization code is detected only when $$0 < \text{bit\_count} \mod \text{sync\_period} \leq \text{sync\_len}$$

Here, it is also possible to detect the synchronization code under consideration of the presence of an error in the synchronization code.

Here, by the bit inserter 211 of the output coding apparatus 200 shown in FIG. 4, when the bitstream has been converted by inserting bits in such a way that the Hamming distance thereof from the synchronization code becomes 2*n+1 under consideration of an error less than n bits, even if the code having a Hamming distance less than n from the true synchronization code is decided as the synchronization code, as far as the erroneous bit is less than n bits, it is possible to prevent the synchronization code from being detected erroneously.

Figure 11:
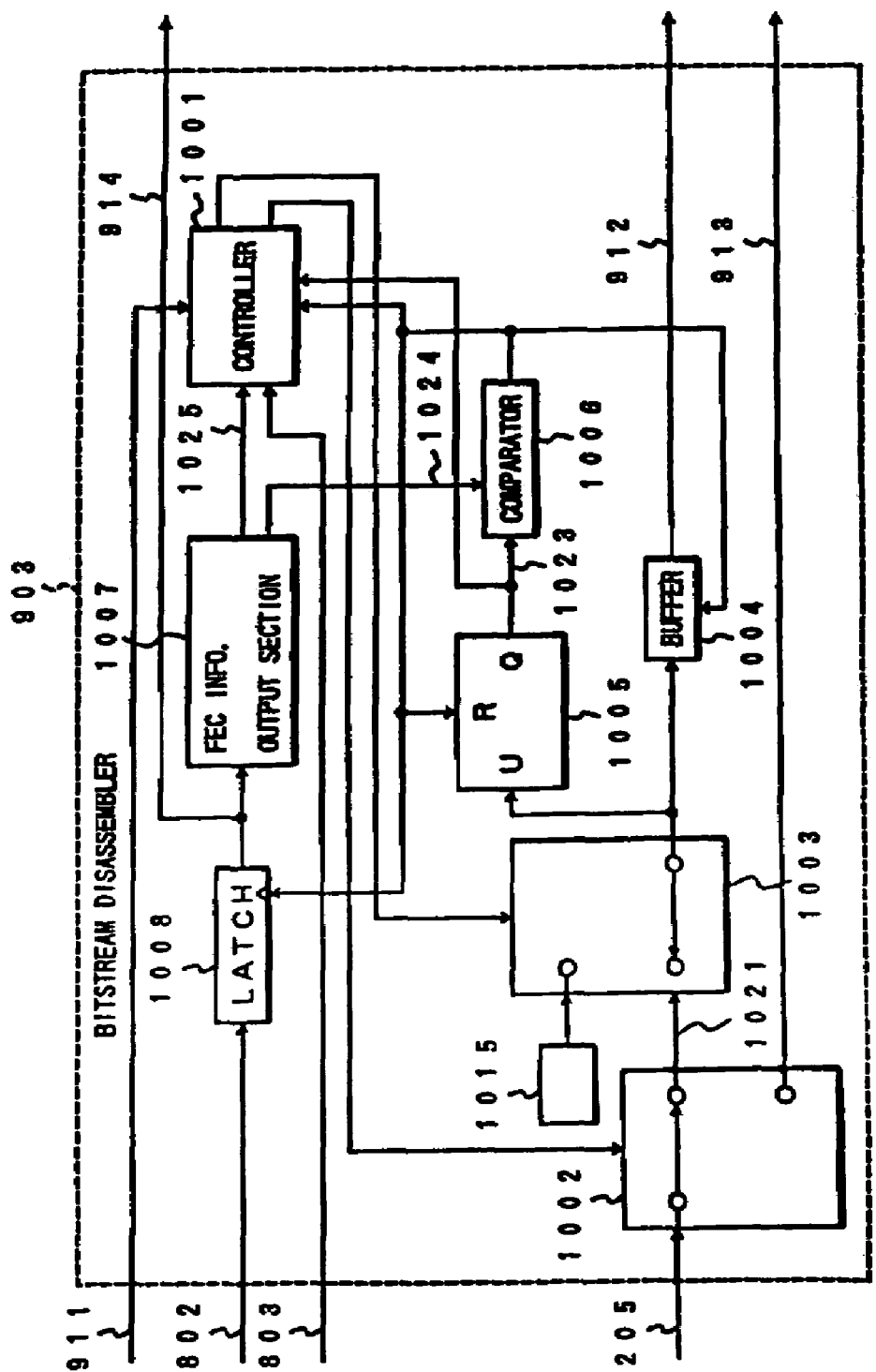
FIG. 11 is a block diagram showing a bitstream disassembler of the input decoding apparatus shown in FIG. 10.

FIG. 11 is a block diagram showing the bitstream disassembler 903 shown in FIG. 10. The input bitstream 205' is switched to the information bits 1021 and the check bits 913 by a first switch 1002 controlled by a controller 1001 (described later). When the information bits 1021 are outputted from the first switch 1002, the information bit length of the information bits 1021 are stored by a buffer 1004 via a second switch 1003. A counter 1005 counts the number of the output bits from the second switch 1003. The count value 1023 of the counter 1005 is compared with the information bit length 1024 outputted by an error correction and/or detection code (i.e., FEC) information output section 1007 by a comparator 1006. When both match, the counter 1005 is reset, and the FEC sort ID signal 802 indicative of the sort of the error correction and/or detection code is latched by a latch circuit 1008. Further, the information bits 912 are outputted from the buffer 1004. Further, the output 914 of the latch circuit 1008 is inputted to the error correction and/or detection code information output circuit 1007 and further to the error correction and/or detection decoder 904 shown in FIG. 10.

As already explained, the check bits of the error correction and/or detection code are shifted in position so as to be formed between the information bits of the error correction and/or detection code arranged backward in the bitstream 205. Therefore, the controller 1001 controls the switch 1002 in such a way that these position-shifted check bits can be separated from the information bits. After the information bits of the one-block error correction and/or detection code have been inputted, the count value 1023 matches the information bit length 1024 in the comparator 1006. In response to this match signal, the controller 1001 receives the check bit length 1025 from the error correction and/or detection information output circuit 1007 to calculate the check bit position inserted between the information bits. Here, when the count value 911 indicative of the number of inputted bits of the bitstream 205' (obtained when the comparator 1006 outputs the match signal) is denoted by bit_count; and the check bit length is denoted by check_len, the check bit start position check_start is $$check\_start = (bit\_count/sync\_period + 1) * sync\_period - check\_len$$

and the check bit end position check_end is $$check\_end = (bit\_count/sync\_period + 1) * sync\_period$$

That is, the controller 1001 controls the switch 1002 so that the check bits 913 can be outputted when the count value 911 lies between check_start and check_end.

Further, since the error correction and/or detection coding is executed by the degenerative code at the last of one frame, a special processing is necessary. At the last of one frame, the synchronization detector 901 outputs a signal 803 indicative of that the synchronization code of the succeeding frame has been detected. In response to this signal, the controller 1001 calculates the position of the last error correction and/or detection check bit in the frame and the number of insufficient information bits. Here, the assumption is made that the count value 911 of the number of bits of the bitstream 205' inputted when the last error correction and/or detection code of one frame is started to be inputted is denoted by pre_last_count; the count value 911 at a time when the one-frame bitstream 205' has been inputted is denoted by total_count; the count value 911 at the processing is denoted by bit_count; the check bit length of the last error correction and/or detection code of one frame is denoted by last_check_len; and the check bit length of the second-last error correction and/or detection code is denoted by pre_last_check_len. First, since the error correction code is a punctured code and further the bit is inserted, the overs and shorts of the information bits are calculated. Here, the number of information bits last_info_len of the last error correction and/or detection code of one frame included in the output bitstream 205 is $$last\_info\_len = total\_count - last\_check\_len - pre\_last\_count - pre\_last\_check\_len$$

Then, when last_info_len is shorter than the information length info_len of the error correction code, the degenerative code is decided, so that the switch 1003 is switched so as to output the bit pattern from the insertion bit generator 1015 during the period between last_info_len and info_len of the count value 1023, in order to supply the insufficient information bits due to the degenerative code. Here, the bit pattern outputted by the insertion bit generator 1015 is the same as that generated by the insertion bit generator 705 of the coder shown in FIG. 8.

On the other hand, when last_info_len is longer than info_len, this information bit length is decided as inserted bits, and the bit portion of the count value more than info_len is not outputted as the information bits 912. On the other hand, the switch 1002 is so controlled that the output bitstream 205 is outputted as the check bits, when the bit count of the check bits is $$total\_count - check\_len < bit\_count \leq total\_count$$

The error correction and/or detection decoder 904 inputs the information bits 912 and the check bits 913 outputted by the bitstream disassembler 903, decodes the error correction and/or detection code on the basis of the FEC sort ID signal 914 indicative of the sort of the error correction and/or detection code latched by the latch circuit 1008 shown in FIG. 11, and outputs the error-corrected bitstream 915 and the error-detected signals 804.

The error-corrected bitstream 915 is inputted to the insertion bit remover 905 to remove the insertion bits inserted by the bit inserter 211 of the output coding apparatus 200, in order to prevent pseudo-synchronization signal from being generated. As already explained, since the bits are inserted at only the synchronization code insertion positions, the synchronization code insertion position can be decided on the basis of the count value 911 of the counter 902.

For instance, when the synchronization code word is that as shown in FIG. 6 and further when the bits are inserted by the bit inserter 211 at "0000 . . ." portion of the first sync_len bits in such a way that the Hamming distance from the synchronization code is more than (2*n+1), the number (−n0) of "1" in {sync_0_len−(2*n+1)} bits beginning from the synchronization code insertion position is counted, when n0 is less than 2*n+1, bits of (2*n+1−n0) are removed. Here, however, since the insertion bits are determined as "1", when the bit decided by the insertion bit remover 905 as the insertion bit is "0", this is regarded as that an error is mixed in the synchronization code insertion block. In this case, therefore, the error detection signal 804 is outputted.

As described above, the bitstream 801 decoded by the input decoding apparatus 800 is reverse multiplexed by the reverse multiplexer 811. In this operation, the code word multiplexed as shown in FIG. 3 is separated and then outputted. Further, this reverse multiplexer 811 operates in linkage with the first and second variable length decoders 806 and 810, respectively.

In operation in FIG. 9, first when a synchronization code detection signal 803 is inputted from the output decoding apparatus 800, the reverse multiplexer 811 is initialized for one-frame processing. Then, the reverse multiplexer 811 outputs the sort of the error correction and/or detection code corresponding to the picture header, as the FEC sort ID signal 802 indicative of the sort of the error correction and/or detection code, inputs the bitstream 801, and decodes the picture header 302 to check whether there exists any error in the decoded picture header. When there exists no error, the reverse multiplexer 811 outputs the sort of the error correction and/or detection code corresponding to the prediction mode information 303 as the FEC sort ID signal 802, inputs the bitstream 801, multiplexes the prediction mode information, and then outputs the motion compensation adaptive prediction information code 842 to the second variable length decoder 810.

When having decoded all the prediction mode information (the motion compensation adaptive prediction information code 842), the second variable length decoder 810 outputs an end signal to the reverse multiplexer 811. In response to this end signal, the reverse multiplexer 811 outputs the FEC sort ID signal indicative of the sort of the error correction and/or detection code corresponding to the motion vector information 304, and starts the reverse multiplex processing of the motion vector information 304. The reverse multiplexed motion vector information is outputted to the second variable length decoder 810 for decoding. After having decoded all the motion vector information, the second variable length decoder 810 outputs an end signal to the reverse multiplexer 811. In response to this end signal, the reverse multiplexer 811 outputs the FEC sort ID signal indicative of the sort of the error correction and/or detection code corresponding to the residual DCT coefficient 305, reversely multiplexes the residual DCT coefficients 305, and outputs the reversely multiplexed results to the first variable length decoder 806. The first variable length decoder 806 decodes the residual DCT coefficients 305.

As described above, the sort of the error correction and/or detection code is decided by the reverse multiplexer 811 in accordance with the multiplexing rule prescribed in the same way as with the case of the output coding apparatus 200. Therefore, it is unnecessary to add the header information indicative of the sort of the error correction and/or detection code to the output bitstream 205.

In the error correction and/or detection decoder 904 shown in FIG. 10, there exists the case where a mixture of an error with the inputted bitstream 205' can be detected by the error detection code. In addition, there exist the case where an erroneous bit insertion can be detected by the insertion bit remover 905. In these error cases, the input decoding apparatus 800 outputs an error detection code 804. Further, when a code word not stored in a variable length word table is detected in the variable length decoding processing, a mixture of an error is decided. Further, when the presence of a portion departing from the multiplexing rule is decided by the reverse multiplexer 811 during the reverse multiplexing processing, it is discriminated that an error is mixed. In these cases, in order to prevent the reproduced picture from being deteriorated largely, the input decoding apparatus 800 and the reverse multiplexer 811 execute the following processing:

(1) When an error is detected in the residual DCT coefficient, the residual at the corresponding portion is set to zero. In this case, when the intra-coding mode is selected as the prediction mode, the reproduced picture signals can be predicted on the basis of the already reproduced frame or the reproduced video signals in the surrounding area.

(2) When an error is detected in the prediction mode information and the motion vector, if it is possible to presume the prediction mode information or the motion vector information on the basis of the prediction mode information or the motion vector information existing in the surrounding area, these information can be used. If impossible, however, the reproduced picture signals are predicted on the basis of the reproduced picture signals in the already reproduced frame or existing in the surrounding area.

(3) When an error is detected in the picture header, since the picture quality deteriorates largely when decoded as it is, the reproduced picture of the preceding frame is used as it is, as the reproduced picture of the present frame.

In the above-mentioned processing in the items (1) to (3) above, when the error exerts a harmful influence upon the following code till the succeeding synchronization code, because the variable length coding is used, the similar processing as above is executed for the error-affected portion.

In the above-mentioned description, an example where the synchronization code detector 901 detects the synchronization code at only the synchronization code insertion positions (for each sync_period bits) has been explained. However, there exists the case where a bit is lost or an erroneous bit is inserted according to the transmission and/or storage medium. In this case, the synchronization code is detected at the position other than the synchronization code insertion position, and, the position where the synchronization code can be detected is decided as the synchronization code insertion position.

Further, in the above description, although an example where the moving picture is high-efficiency compression-coded and then transmitted and/or stored has been explained by way of example, it is of course possible to apply the coding and decoding apparatus according to the present invention to the case where still picture or audio or other information are transmitted and/or stored. For instance, in the case where still picture signals are compression, coded at a high efficiency by use of the orthogonal transform, it is preferable to switch the error correction and/or detection codes in such a way that the lower frequency components of the transform coefficients can be protected from error more securely. For instance, in the method of coding audio signals by modeling voice with a sound source and a sound path filter, it is preferable that the error correction and/or detection codes are switched in such a way that the pitch period and the sound path filter can be protected from error more securely.

As described above, in the coding and decoding apparatus according to the present invention, since the synchronization code is inserted at only the synchronization code insertion position at regular intervals and further since the check bits of the error correction and/or detection code are shifted so as to be arranged at a position other than the synchronization code insertion position, even if the bit pattern the same as that of the synchronization code is formed in the check bits, the bit pattern the same as that of the synchronization code will not be formed at the synchronization code insertion position at which the synchronization code is detected, so that it is possible to perfectly eliminate the possibility that the synchronization is detected erroneously, from the principle standpoint.

Further, when the bits are inserted into the bitstream arranged at the synchronization code insertion position in such a way as not to form the pseudo-synchronization, it is possible to eliminate such a prior art difficulty that the code word must be constructed in such a way that the bit pattern the same as that of the synchronization bits will not be formed.

In addition, in the present invention, since the bits are inserted under consideration of erroneous synchronization code; that is, since the bit train arranged at the synchronization code insertion position is converted in such a way that the Hamming distance from the synchronization code exceeds a predetermined value and further reversely converted by the decoding apparatus, the bit pattern the same as that of the synchronization code will not be included in the bit train, so that it is possible to secure that an erroneous detection of the synchronization code can be prevented as far as the number of bits is less than a predetermined value. As a result, the possibility of the erroneous detection of the synchronization code can be reduced. Further, when the above-mentioned conversion is executed, even if an error is mixed with the bitstream, since it is possible to discriminate the synchronization code from the bitstream other than the synchronization code, it is possible to reduced the possibility that the synchronization code is detected erroneously.

Further, since the error correction and/or detection coding is executed after the code word has been converted by bit insertion, the bit insertion can be protected from the error occurrence. Therefore, as compared with the prior art method such that the bits are inserted after the error correction and/or detection coding has been completed, it is possible to reduce the possibility that the erroneous bit insertion occurs. In addition, since the bit insertion is executed only at the synchronization code insertion position, an increase of the code quantity due to the bit insertion can be reduced, as compared with he prior art case where the bits are inserted all over the bitstream, with the result that the coding efficiency can be increased.

Further, in the present invention, since the error correction and/or detection code immediately before the synchronization code is formed as a degenerative code, it is possible to reduce the number of insertion bits for compensating for the remainder of the information bits immediately before the synchronization code, as compared with the prior art coding apparatus, with the result that the coding efficiency can be further increased.

Further, in the present invention, since the error correction and/or detection codes are switched in accordance with the multiplexing rule of the high efficiency compression coding apparatus for audio and video signals and according to the information sort of the inputted bitstream, and further since the error correction and/or detection codes are switched by deciding the sort of the error correction and/or detection code on the basis of the decoded information on the decoding apparatus side, it is unnecessary to add the header information indicative of the sort of the error correction and/or detection code and thereby the number of bits assigned to the audio or video high efficiency compression coding can be increased, with the result that it is possible to increase the quality of the audio and video information to that extent.

What is claimed is:

1. A coding apparatus, comprising:
    coding means for coding an inputted bitstream by an error correction and/or detection code composed of information bits, check bits and a stuffing code; and
    bitstream assembling means for assembling an outputted bitstream by inserting a synchronization code at any one of a plurality of synchronization code insertion positions previously determined in the outputted bitstream, arranging the information bits at desired positions of the bitstream and arranging the check bits at positions other than the synchronization code insertion positions in the bitstream, the stuffing code having the number of bits necessary to shift the position of the check bits, and an interval of the synchronization code insertion positions being longer than a length of the synchronization code.

2. The coding apparatus as set forth in claim 1, wherein said plurality of synchronization code insertion positions are arranged at a constant interval therebetween.

3. The coding apparatus as set forth in claim 1, wherein said plurality of synchronization code insertion positions are periodically arranged.

* * * * *